United States Patent
Song et al.

(10) Patent No.: US 7,800,954 B2
(45) Date of Patent: Sep. 21, 2010

(54) APPARATUS FOR READING DATA AND METHOD USING THE SAME

(75) Inventors: Seung-Hwan Song, Incheon (KR); Jun Jin Kong, Yongin-si (KR); Sung Chung Park, Daejeon (KR); Dong Hyuk Chae, Seoul (KR); Seung Jae Lee, Hwaseong-si (KR); Dong Ku Kang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 317 days.

(21) Appl. No.: 12/007,921

(22) Filed: Jan. 17, 2008

(65) Prior Publication Data

US 2008/0285340 A1 Nov. 20, 2008

(30) Foreign Application Priority Data

May 14, 2007 (KR) .................. 10-2007-0046622
Jul. 27, 2007 (KR) .................. 10-2007-0075857

(51) Int. Cl.
*G11C 11/34* (2006.01)

(52) U.S. Cl. .................. 365/185.22; 365/185.24; 365/185.2; 365/185.17; 365/210.1

(58) Field of Classification Search ............ 365/185.24, 365/185.33, 185.22, 210.1, 185.25, 189.15
See application file for complete search history.

(56) References Cited

U.S. PATENT DOCUMENTS

| | | | | |
|---|---|---|---|---|
| 5,933,366 A | * | 8/1999 | Yoshikawa | 365/185.03 |
| 6,992,932 B2 | * | 1/2006 | Cohen | 365/185.2 |
| 2004/0257876 A1 | * | 12/2004 | Vimercati | 365/185.21 |

FOREIGN PATENT DOCUMENTS

| | | |
|---|---|---|
| JP | 2000-228092 | 8/2000 |
| JP | 2003-263897 | 9/2003 |
| KR | 10-2007-0023970 | 3/2007 |

* cited by examiner

*Primary Examiner*—Pho M Luu
*Assistant Examiner*—Tha-O Bui
(74) *Attorney, Agent, or Firm*—Harness, Dickey & Pierce, P.L.C.

(57) ABSTRACT

The method for reading data according to example embodiments includes comparing a threshold voltage of a memory cell with a first boundary voltage, comparing the threshold voltage with a second boundary voltage having a higher voltage level than that of the first boundary voltage, and determining data of the memory cell based on the threshold voltage, the first boundary voltage, and the second boundary voltage.

24 Claims, 11 Drawing Sheets

| MESSAGE WORD | CODE WORD | DISTANCE (D) |
|---|---|---|
| 0000 | 0000000 | 3 |
| 0001 | 1010001 | 0 |
| 0010 | 1110010 | 2 |
| 0011 | 0100011 | 3 |
| 0100 | 0110100 | 3 |
| 0101 | 1100101 | 2 |
| 0110 | 1000110 | 2 |
| 0111 | 0010111 | 1 |
| 1000 | 1101000 | 4 |
| 1001 | 0111001 | 3 |
| 1010 | 0011010 | 3 |
| 1011 | 1001011 | 2 |
| 1100 | 1011100 | 2 |
| 1101 | 0001101 | 3 |
| 1110 | 0101110 | 5 |
| 1111 | 1111111 | 2 |

| $X_1$ | $X_2$ | s | e | cp |
|---|---|---|---|---|
| 0 | 0 | 000 | 0000000 | 1010001 |
| 0 | 1 | 111 | 0000010 | 1010001 |
| 1 | 0 | 011 | 0000100 | 1010001 |
| 1 | 1 | 100 | 1000000 | 0010111 |

APPARATUS FOR READING DATA AND METHOD USING THE SAME

PRIORITY STATEMENT

This application claims priority under 35 U.S.C §119 to Korean Patent Application No. 2007-0046622, filed on May 14, 2007, and Korean Patent Application No. 2007-0075857 filed on Jul. 27, 2007, in the Korean Intellectual Property Office, the entire contents of which are incorporated herein by reference.

BACKGROUND

The size of a threshold voltage of a flash memory cell may be adjusted based on data to be programmed, when programming data. For example, the size of the threshold voltage of the flash memory denotes data programmed in the flash memory cell.

In order to read data programmed in the flash memory cell, the threshold voltage of the flash memory cell may be compared with at least one reference voltage, such as a read level. For example, for a flash memory cell of a Single Level Cell (SLC) and a reference voltage is A, when a threshold voltage of a read flash memory cell is less than the reference voltage A, data programmed in the flash memory cell may be read as 1, and when the threshold voltage of the read flash memory cell is greater than the reference voltage A, data programmed in the memory cell may be read as 0. However, a threshold voltage of a flash memory cell in which data is programmed may be changed into a threshold voltage having a different level by different factors, such as charge loss, floating poly coupling, and other factors. In this regard, when the threshold voltage of the flash memory cell is changed to be near the reference voltage, reliability may be reduced with respect to data of a read flash memory cell. For example, in a flash memory cell having a threshold voltage near the reference voltage, a number of errors may occur such that data may be read data as 0 even though programmed data is 1, and conversely, data may be read data as 1 even though programmed data is 0.

SUMMARY

Example embodiments provide a method for reading data in which a voltage area having a deteriorated reliability between states indicating what the data of the flash memory should be determined as, and then when a threshold voltage of the flash memory cell is positioned at a voltage area having a deteriorated reliability, the data of the flash memory cell is outputted as a non-determinable value.

Example embodiments provide a method for reading data in which data of memory cells including a non-determinable value is determined by decoding data of flash memory cells having been read through the method for reading data, thereby increasing reliability with respect to data of read memory cells.

Example embodiments provide a method for reading data in which a non-determinable value is determined as data having a high reliability through a decoding process, even though the non-determinable value is outputted due to the change of the threshold voltage of the flash memory cell.

Example embodiments provide a method for reading data including comparing a threshold voltage of a memory cell with a first boundary voltage; comparing the threshold voltage with a second boundary voltage having a higher voltage level than that of the first boundary voltage; and determining data of the memory cell based on the compared results between the threshold voltage and the first boundary voltage, and between the threshold voltage and the second boundary voltage.

In example embodiments, the determining of the data determines the data of the memory cell as a preset non-determinable value when the threshold voltage is between the first and the second boundary voltages.

In example embodiments, the memory cell is of a Multi-Level Cell (MLC) method or a Single Level Cell (SLC) method.

In example embodiments, the first and the second boundary voltages correspond to two predetermined voltages between boundary areas of identifying data programmed in the memory cell.

In example embodiments, the method for reading data further includes decoding the determined data of a plurality of memory cells; and determining data programmed in the memory cells through the decoding.

In example embodiments, the decoding performs a distance decoding by using the data of the memory cells.

In example embodiments, the decoding calculates a syndrome by using the data of the memory cells, and performs a decoding by using the calculated syndrome.

Example embodiments provide an apparatus for reading data including a memory cell; a voltage comparing unit which compares a threshold voltage of the memory cell with a first boundary voltage, and compares another threshold voltage of the memory cell with a second boundary voltage having a higher voltage level than that of the first boundary voltage, and then generates a result value depending on the compared results; and a data read unit which determines the data of the memory cell based on the result value inputted from the voltage comparing unit.

In example embodiments, the apparatus for reading data further includes a decoding unit which receives and decodes an input of data of a plurality of memory cells determined by the data read unit; and a data determining unit which receives an input of the data of the memory cells decoded by the decoding unit and determines data programmed in the memory cells through the decoded data of the memory cells.

BRIEF DESCRIPTION OF THE DRAWINGS

The above and other features and advantages of example embodiments will become more apparent by describing them in detail with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EXAMPLE EMBODIMENTS

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1:
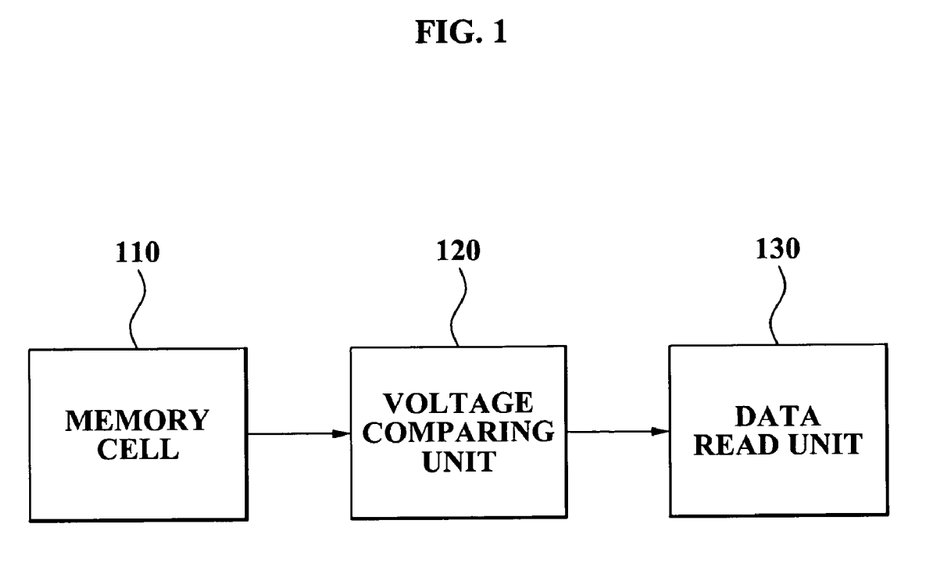
FIG. 1 is a block diagram illustrating an apparatus for reading data according to example embodiments.

FIG. 1 is a block diagram illustrating an apparatus for reading data according to example embodiments.

Referring to FIG. 1, an apparatus for reading data may include a voltage comparing unit 120 and a data read unit 130.

The voltage comparing unit 120 may generate a comparison result by comparing a threshold voltage of a memory cell 110 with a first boundary voltage and a second boundary voltage having a higher voltage level than that of the first boundary voltage.

The first and the second boundary voltages may be included in a boundary area identifying data programmed between states indicative of data (either 0 or 1) programmed in the memory cell 110. In example embodiments, the boundary area identifying the programmed data may be an area where reliability is reduced with respect to read data, and accordingly, at least one boundary area exists. For example, when the memory cell 110 is a Single Level Cell (SLC), one boundary area identifying the programmed data may exist, and when the memory cell 110 is a Multi-Level Cell, at least two boundary areas may exist.

The first and the second boundary voltages may be minimum or maximum voltages of a boundary area where reliability of a read data is insufficient when reading data from the memory cell 110.

The boundary area may vary depending on given circumstances, however, may be determined in consideration of different factors, for example, charge loss, floating poly coupling, and the like.

The memory cell 110 may be a flash memory cell. The flash memory cell may be either a NAND flash memory cell, a NOR flash memory cell.

The memory cell 110 may be either a Multi-Level Cell (MLC) or a Single Level Cell (SLC).

The data read unit 130 may receive an input of a result value generated from the voltage comparing unit 120, and may determine data of a memory cell based on the inputted result value. For example, the data read unit 130 may read the data of the memory cell based on the result value.

The data read unit 130 may read data of the memory cell 110 as a non-determinable value when a threshold voltage of the memory cell 110 is between the first and the second boundary voltages. For example, the data read unit 130 may fail to determine data of the memory cell as either 0 or 1, when a result value inputted from the voltage comparing unit 120 is a result value in which the threshold voltage of the memory cell 110 represents a voltage between the first and the second boundary voltages. Thus, the data read unit 130 determine the data of the memory cell as a specific value different from 0 or 1.

When the data of the memory cell having been read by the data read unit 130 is a non-determinable value, the non-determinable value may be changed into a determined value through a decoding process according to an example embodiment.

Figure 2:
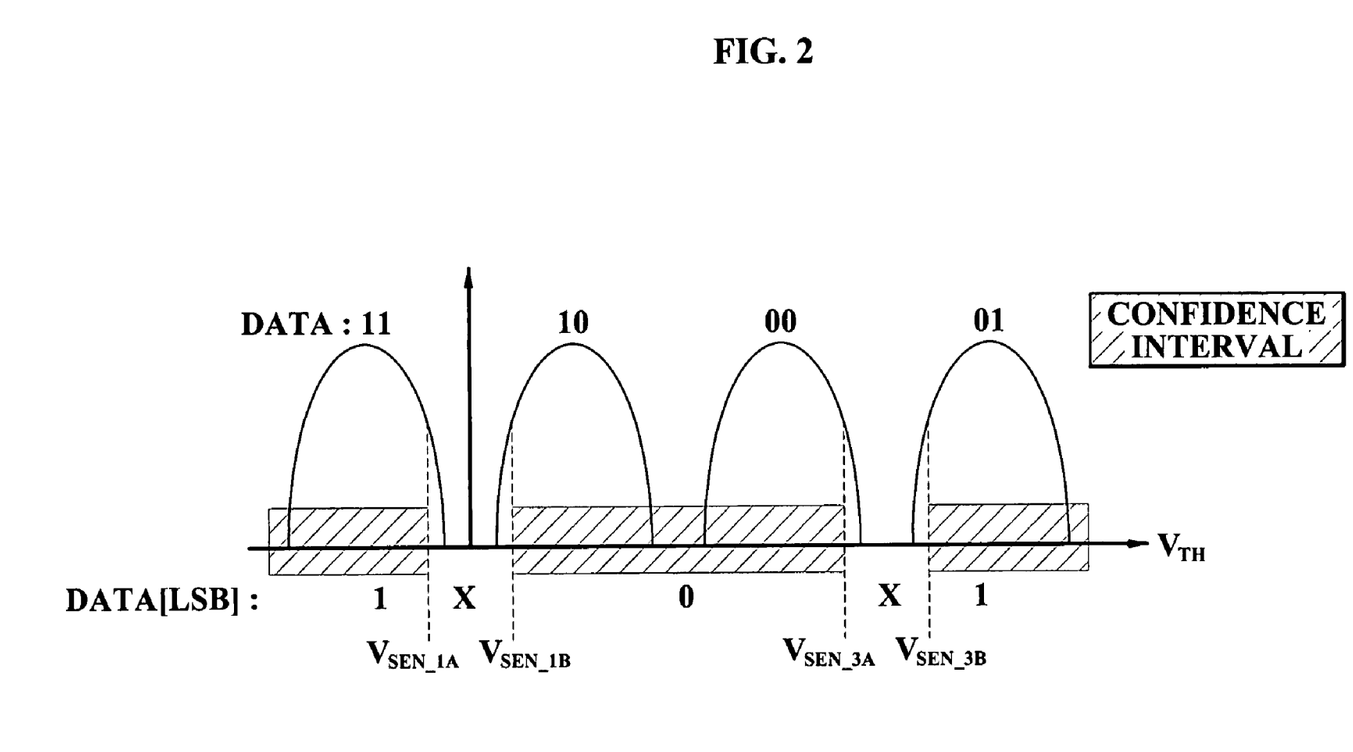
FIG. 2 is an example illustrating an apparatus for reading data according to example embodiments.

FIG. 2 is an example illustrating an apparatus for reading data according to an example embodiment.

FIG. 2 illustrates Least Significant Bit (LSB) data of a memory cell operating in four levels.

Referring to FIG. 2, the LSB data of the memory cell may be read by using two boundary voltages between boundary areas identifying the LSB data of the memory cell, that is, 0 and 1.

The LSB data of the memory cell is read by using a first boundary voltage ($V_{SEN\_1A}$) and a second boundary voltage ($V_{SEN\_1B}$) between 1 and 0 of the LSB data of the memory cell, that is, between binary 11 and binary 10 of data of the memory cell, and by using a first boundary voltage ($V_{SEN\_3A}$) and a second boundary voltage ($V_{SEN\_3B}$) between 0 and 1 of the LSB data of the memory cell, that is, between binary 00 and binary 01 of data of the memory cell.

For example, when a threshold voltage of a memory cell for reading LSB data is either less than $V_{SEN\_1A}$ or greater than $V_{SEN\_3B}$, the LSB data may be read as 1, and when the threshold voltage of the memory cell is a voltage between $V_{SEN\_1B}$ and $V_{SEN\_3A}$ the LSB data may be read as 0.

Also, when the threshold voltage of the memory cell is between either $V_{SEN\_1A}$ and $V_{SEN\_1B}$ or $V_{SEN\_3A}$ and $V_{SEN\_3B}$ the LSB data may be read as a specific value different from either 0 or 1.

According to an example embodiment, when data of a memory cell fails to be read as either 0 or 1 due to the change of a threshold voltage programmed in the memory cell by charge loss, floating poly coupling, and the like, the read data of the memory cell may be read as a non-determinable value, and the non-determinable value may be changed to either 0 or 1 through a decoding process.

Figure 3:
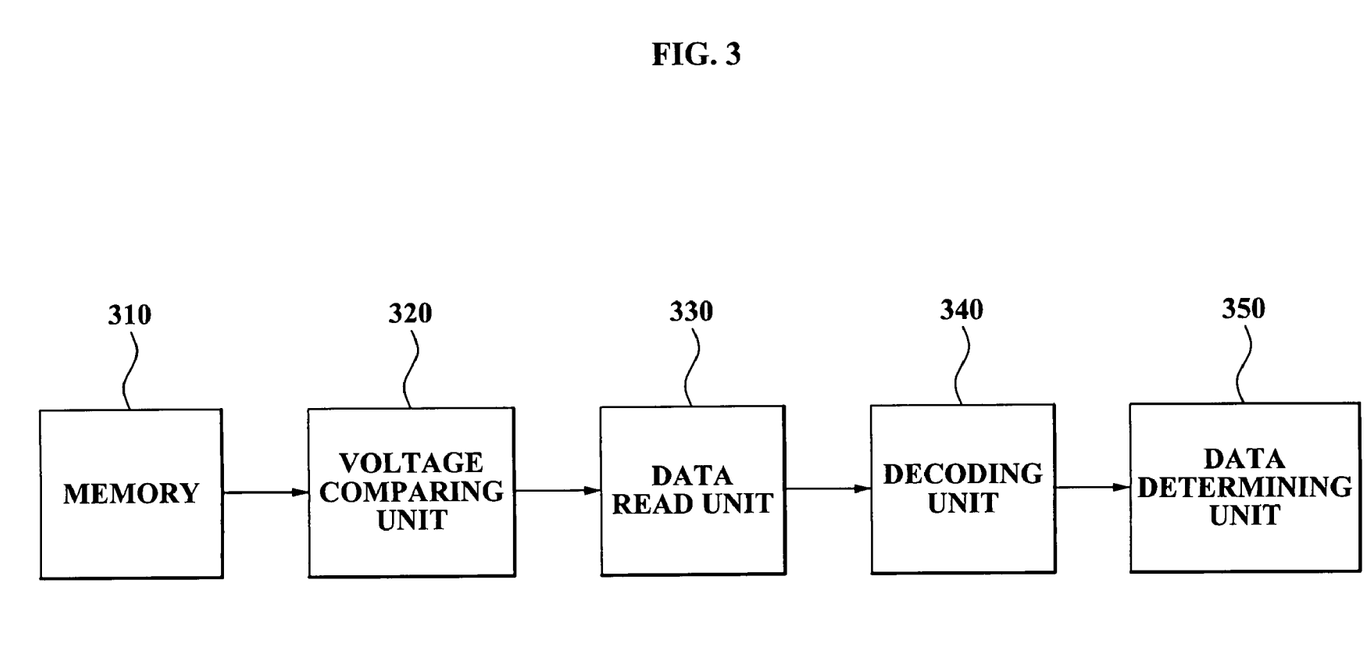
FIG. 3 is a configuration block diagram illustrating an apparatus for reading data according to example embodiments.

FIG. 3 is a configuration block diagram illustrating an apparatus for reading data according to another example embodiment.

Referring to FIG. 3, an apparatus for reading data may include a voltage comparing unit 320, a data read unit 330, a decoding unit 340, and/or a data determining unit 350.

The voltage comparing unit 320 may generate a comparison result by comparing threshold voltages of memory cells constituting a memory 310 with a first boundary voltage, and a second boundary voltage having a higher voltage level than that of the first boundary voltage, respectively.

The first and second boundary voltages may be between boundary areas identifying data programmed in respective memory cells.

The first and second boundary voltages may be minimum and maximum voltages of a boundary area where reliability of a read data is insufficient when reading data from a memory cell.

Memory cells may be flash memory cells. The flash memory cells may be either NAND flash memory cells or NOR flash memory cells.

Memory cells may be memory cells of either an MLC method or an SLC method.

The data read unit 330 may receive an input of a result value generated from the voltage comparing unit 320, and determine data of memory cells based on the inputted result value.

The data read unit 330 may read data of a memory cell as a non-determinable value when a result value represents a voltage between the first and the second boundary voltages according to the result value inputted from the voltage comparing unit 320. The data read unit 330 may determine unreliable data of the memory cell as a specific value different from either 0 or 1.

The decoding unit 340 may decode data of memory cells determined by the data read unit 330.

The decoding unit 340 may perform a distance decoding by using remaining data except for data of non-determinable values from among data of the memory cells determined by the data read unit 340.

The decoding unit 340 may perform decoding by using a syndrome calculation in consideration of respective cases for data of non-determinable values from among data of memory cells determined by the data read unit 330. The data determining unit 350 may determine data programmed in memory cells by using a decoded result obtained by the decoding unit 340.

The data determining unit 350 may determine data programmed in memory cells based on a distance calculated by a distance decoding, when the decoding unit 340 performs decoding through the distance decoding.

An example in association with a process for determining data through the distance decoding will be described below with reference to FIG. 4.

Figure 4:
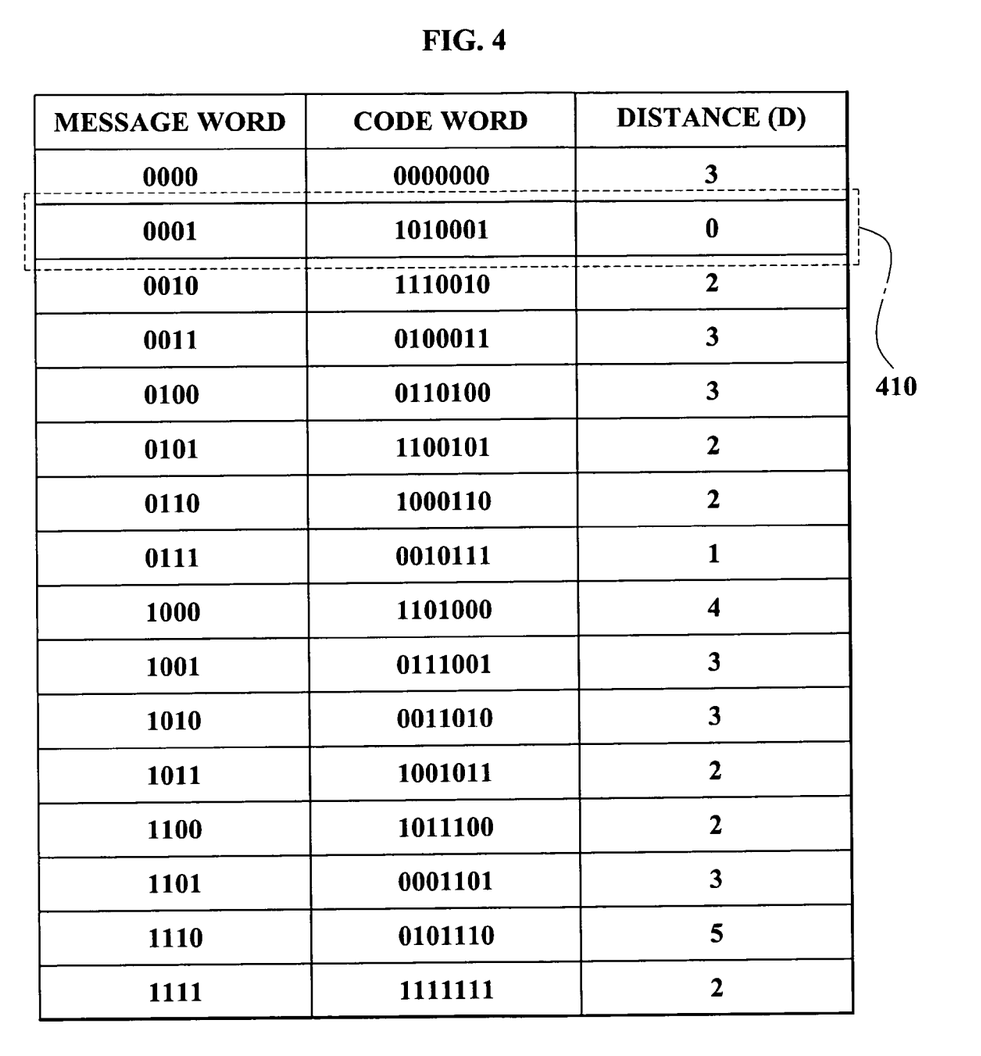
FIG. 4 illustrates an example distance between an available program code word and a read code word when a Hamming code is used as a code word to be programmed in memory cells and a read code word from the memory cells is "1010XX1".

FIG. 4 illustrates a distance between an available program code word and a read code word when a Hamming code is used as a code word to be programmed in memory cells and a read code word from the memory cells is "1010XX1".

X denotes a non-determinable value.

Referring to FIG. 4, the decoding unit 340 may perform a calculation of a distance between available program code words with respect to the Hamming code and the read code word, that is, "1010XX1", by disregarding data of positions corresponding to non-determinable values.

Through a distance calculation performed by using only data of remaining positions disregarding data of positions corresponding to the non-determinable values in the read code word, a distance between the read code word and available program code words may be calculated. For example, when calculating a distance between a second available program code word 410, that is, "1010001" and a read code word, that is, "1010XX1", remaining data when disregarding non-determinable values in the read code word are the same with those of the second available program code word, and accordingly, the distance is 0. Also, when calculating a distance between a third available program code word, that is, "1110010" and a read code word, that is, "1010XX1", a first bit from a right-hand side and a second bit from a left-hand side from among remaining data when disregarding non-determinable values in the read code word are different from those of the third available program code word. Accordingly, the distance is 2.

When a distance between the read code word and available program code words through a distance calculation process as described above is calculated, the data determining unit 350 detects a code word having the least distance value from among the calculated distances, and determines the detected code word as a program code word.

Specifically, in FIG. 4, a code word, that is, "1010001" where a calculated distance is 0, is determined as the program code word. In this case, every non-determinable values of the read code word are 0, and thus, data stored in memory cells are determined as "10100001".

In example embodiments, the data determining unit 350 may determine data programmed in memory cells based on a syndrome calculated when the decoding unit 340 performs decoding by using a syndrome calculation.

An example in association with a process for determining data through decoding by the syndrome calculation will be described below with reference to FIG. 5.

Figure 5:
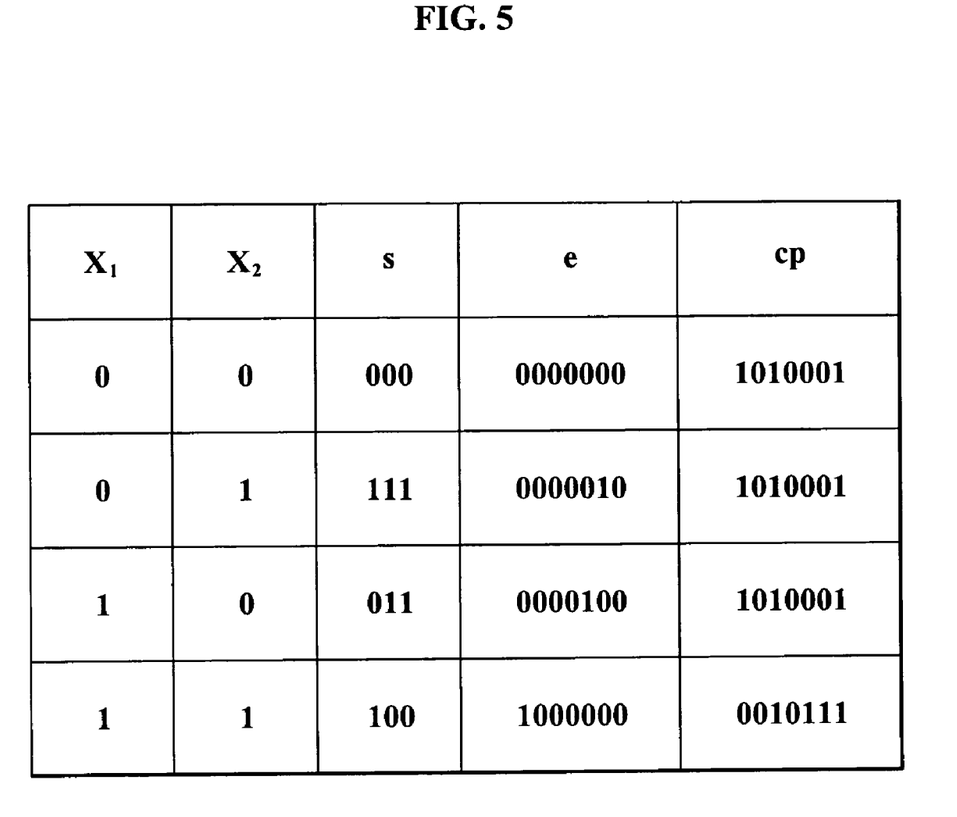
FIG. 5 illustrates an example syndrome when a Hamming code is used as a code word to be programmed in memory cells and a read code word from memory cells is "$1010X_1X_21$".

FIG. 5 illustrates a syndrome when a Hamming code is used as a code word to be programmed in memory cells and a read code word from memory cells is "1010$X_1 X_2$1".

$X_1$ and $X_2$ denotes non-determinable values.

Referring to FIG. 5, the decoding unit 340 may perform a syndrome calculation with respect to a read code word, that is, "1010$X_1 X_2$1". A process of the syndrome calculation with respect to the read code word is well known by those skilled in the art and is therefore omitted here.

A syndrome (s) obtained by the syndrome calculation is "$X_1[0\ 1\ 1]+X_2[1\ 1\ 1]$".

In the syndrome (s) calculated by the decoding unit 340, syndromes are 000, 111, 011, and 100 with respect to each available value, that is, 00, 01, 10, and 11 of $X_1$ and $X_2$, that is, non-determinable values.

The data determining unit 350 verifies erroneous patterns (e) based on syndromes calculated by the decoding unit 340, and determines a cord word programmed in memory cells based on a read code word and erroneous patterns. In example embodiments, the data determining unit 350 calculates available program code words (cp) based on the read code words corresponding to respective non-determinable values and the erroneous patterns, determines an available program code word, that is, "1010001" having the greatest frequency from among the calculated available program code words as a program code word, and then determines data stored in memory cells as "1010001".

Figure 6:
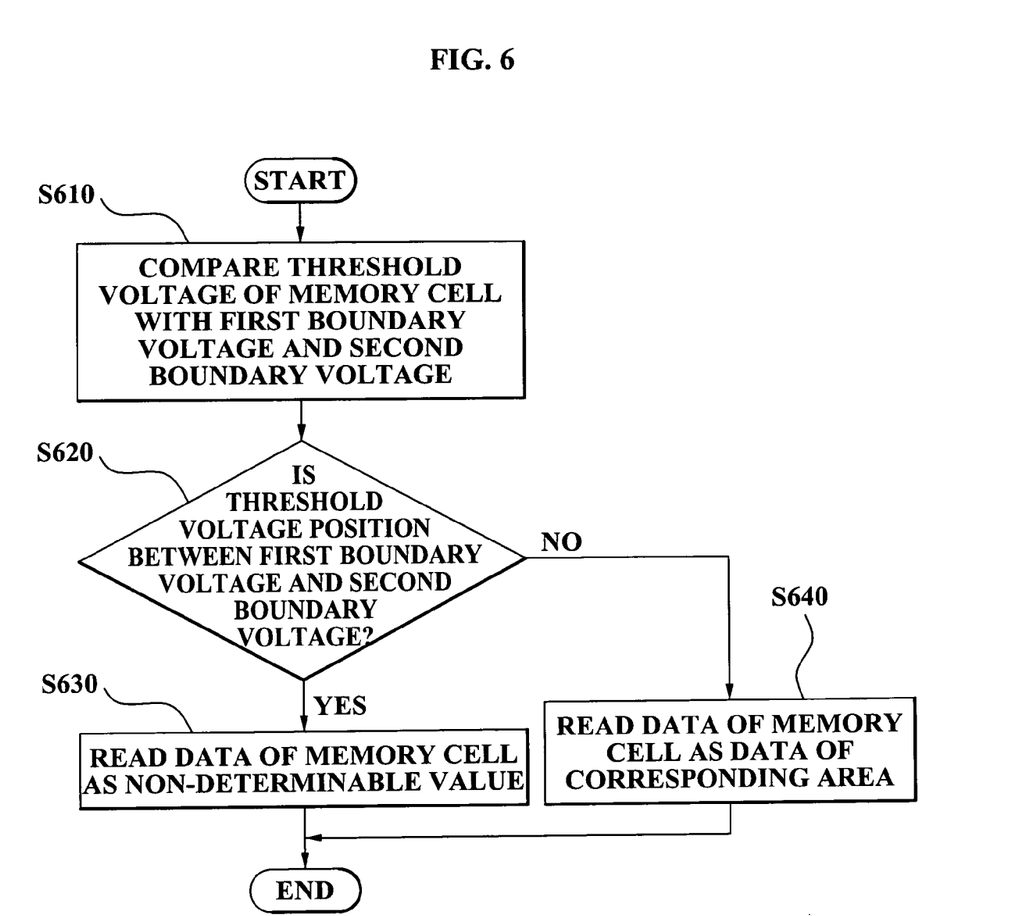
FIG. 6 is an operation flowchart illustrating a method for reading data according to example embodiments.

FIG. 6 is an operation flowchart illustrating a method for reading data according to example embodiments.

Referring to FIG. 6, in operation S610, a method for reading data compares a threshold voltage of a memory cell with a first boundary voltage, and compares the threshold voltage of the memory cell with a second boundary voltage having a higher voltage level than that of the first boundary voltage.

In example embodiments, the first and the second boundary voltages may be two predetermined or given voltages between boundary areas identifying data to be programmed in the memory cell, that is, either 0 or 1.

The number of boundary areas identifying the programmed data may vary depending on operation methods of the memory cell. For example, when the memory cell is of an SLC method, the number of boundary areas identifying the programmed data is one, and when the memory cell is of an MLC method, the number thereof is at least two.

The first and the second boundary voltages are minimum and maximum voltages of a boundary area where reliability of a read data is insufficient when reading data between an area determining data programmed in the memory cell as 0 and an area determining data programmed in the memory cell as 1.

In example embodiments, the boundary area may vary depending on given circumstances, however, may be set in consideration of different factors, for example, charge loss, floating poly coupling, and the like.

In example embodiments, the memory cell may be a flash memory cell, and may be either a NAND flash memory or a NOR flash memory cell.

In example embodiments, the memory cell may be of either an MLC method or an SLC method.

In operation S620, it is determined whether a threshold voltage of a memory cell is between the first and the second boundary voltages, and when the threshold voltage is between the first and the second boundary voltages in terms of the determined result, the data of the memory cell is read as a non-determinable value in operation S630.

Conversely, in operation S640, when the threshold voltage is not between the first and the second boundary voltages in terms of the determined result of operation 620, the data of the memory is read as data determined by a voltage area where a corresponding threshold voltage is. For example, referring to FIG. 2, when the threshold voltage is either less than $V_{SEN\_1A}$ or greater than $V_{SEN\_3B}$, LSB data of the memory cell is read as 1.

Figure 7:
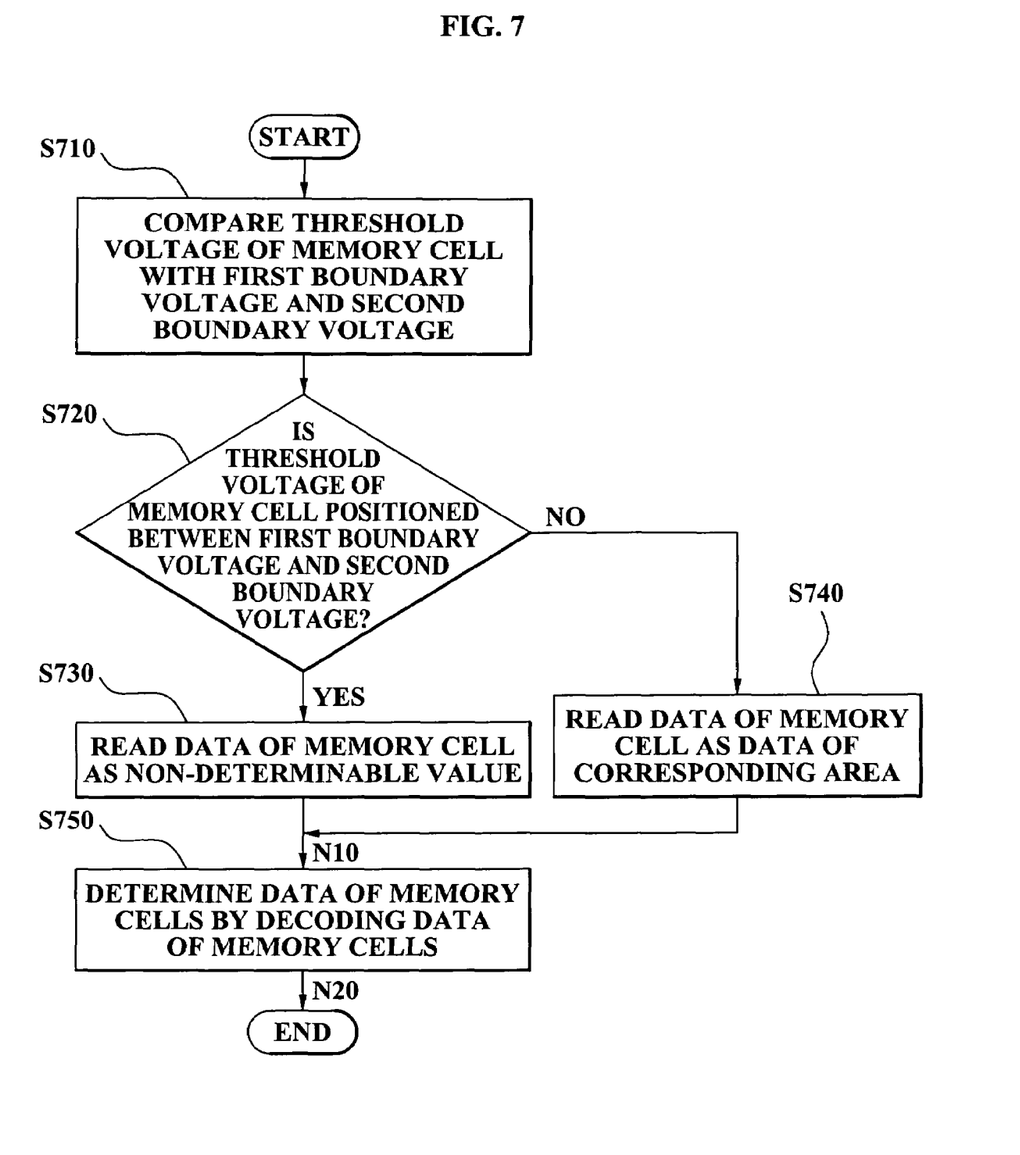
FIG. 7 is an operation flowchart illustrating a method for reading data according to example embodiments.

FIG. 7 is an operation flowchart illustrating a method for reading data according to example embodiments.

Referring to FIG. 7, in operation S710, a method for reading data compares each threshold voltage of memory cells constituting a memory with a first boundary voltage, and compares each threshold voltage thereof with a second boundary voltage.

In example embodiments, the first and the second boundary voltages may be two predetermined or given voltages between boundary areas identifying each data programmed in respective memory cells.

The first and the second boundary voltages are minimum and maximum voltages of a boundary area where reliability of a read data is insufficient when reading data between an area determining data programmed in the memory cell as 0 and an area determining data programmed in the memory cell as 1.

In example embodiments, the memory cells may be flash memory cells, and may be either NAND flash memory cells, or NOR flash memory cells.

In example embodiments, the memory cells may be of either an MLC method or an SLC method.

In operation S720, threshold voltages of memory cells are determined whether they are between the first and the second boundary voltages, and when the threshold voltage is between the first and the second boundary voltages in terms of the determined result, data of a corresponding memory cell is read as a non-determinable value in operation S730.

Conversely, in operation S740, when the threshold voltage of the memory cell fails to be between the first and the second boundary voltages in terms of the determined result of operation 720, data of a corresponding memory is read as data determined by a voltage area where a corresponding threshold voltage is.

In operation S750, data of the read memory cells is decoded, and data of memory cells including a non-determinable value is determined through a decoding process.

In example embodiments, the data of the read memory cells may perform a distance decoding by using remaining data when disregarding data of non-determinable values from among the data of the read memory cells.

Also, the data of the read memory cells may perform decoding by using a syndrome calculation in consideration of respective cases for data of non-determinable values from among the data of the read memory cells.

Figure 8:
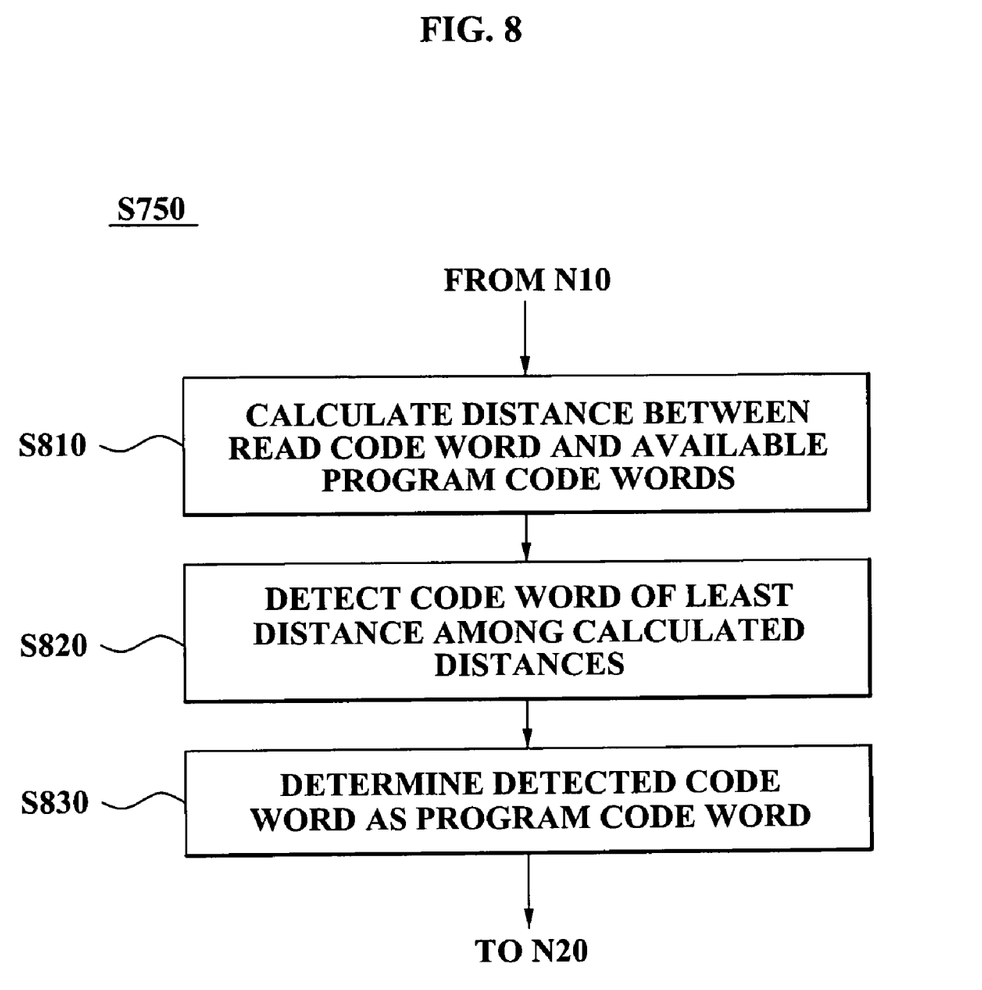
FIG. 8 is an operation flowchart illustrating operation S750 illustrated in FIG. 7, according to example embodiments.

FIG. 8 is an operation flowchart illustrating example embodiments of operation S750 illustrated in FIG. 7.

Referring to FIG. 8, in operation S810, the determining of the data of the memory cells calculates a distance between code words in which data of memory cells is read, and predetermined available program code words.

In example embodiments, the available program code words may vary depending on a code used when programming data in memory cells.

Operation S810 for calculating distances may be performed by using remaining data excluding non-determinable values included in the read code word. In example embodiments, when the read code word is seven bits and two bits are undetermined, a distance between an available program code word and a read code word is calculated by using data of five bits.

In operation S820, an available program code word of a distance having a least value among the calculated distances is detected. In example embodiments, a code word having a greatest probability from among available program code words is detected.

In operation S830, the detected available program code word may be determined as a program code word stored in the memory cells, and data of the memory cells is determined.

Figure 9:
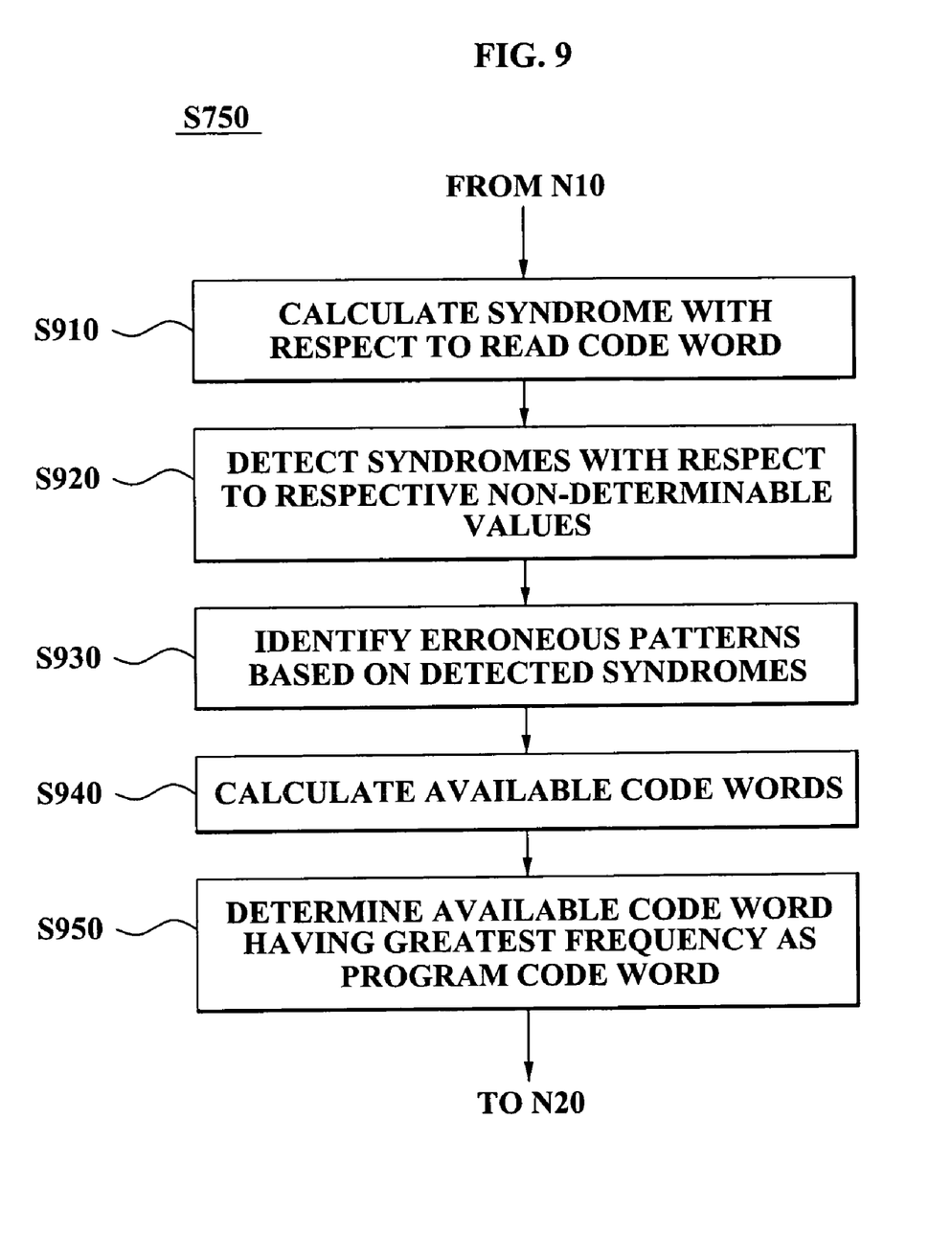
FIG. 9 is an operation flowchart illustrating operation S750 illustrated in FIG. 7, according to example embodiments.

FIG. 9 is an operation flowchart illustrating example embodiments of operation S750 illustrated in FIG. 7, in detail.

Referring to FIG. 9, in operation S910, the determining of the data of the memory cells may calculate a syndrome with respect to read code words, that is, data of the memory cells.

In operation S920, syndromes with respect to respective cases of non-determinable values included in the calculated syndrome may be detected. For example, when two non-determinable values are included in a reception code word, four syndromes are detected.

In operation S930, erroneous patterns corresponding to respective syndromes may be identified based on the detected syndromes.

In operation S940, available program code words may be calculated based on erroneous patterns and read code words. For example, when programming data in memory cells by using a Hamming code, available program code words may be calculated by performing an add operation between read code words applying either 0 or 1 to respective non-determinable values and corresponding erroneous patterns.

In operation S950, an available program code word having a greatest frequency from among the calculated available code words may be determined as a program code word stored in the memory cells, and data of the memory cells is determined.

Figure 10:
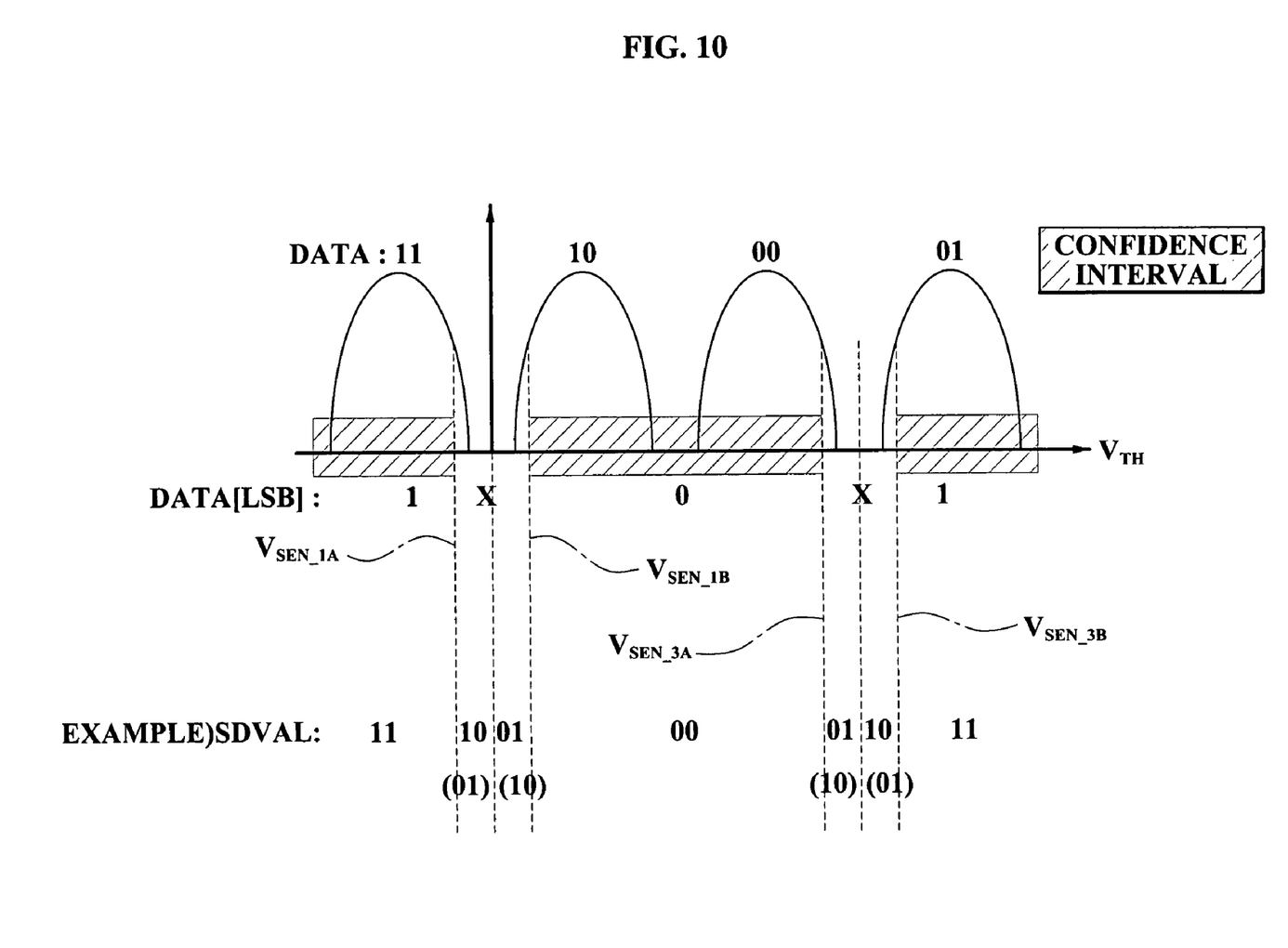
FIG. 10 is a diagram illustrating a soft decision value is additionally defined when comparing with FIG. 2, according to according to example embodiments.

FIG. 10 is a diagram illustrating a soft decision value according to example embodiments. Hereinafter, a method for reading data according to example embodiments will be described with reference to FIG. 10 and also, with reference to FIGS. 1 and 2.

Referring to FIGS. 1 and 2, according to example embodiments, the data read unit 130 receives an input of a result value generated from the voltage comparing unit 120, and determines data of a memory cell based on the inputted result value. In example embodiments, the data read unit 130 may determine data of the memory cell 110 as a non-determinable value when a threshold voltage of the memory cell 110 is between the first and the second boundary voltages, as previously described above.

However, according to example embodiments, the data read unit 130 generates a soft decision value depending on reliability of data and carries out an additional reading operation with respect to unreliable intervals, as necessary, to generate a more accurate soft decision value. Thus, a process for improving the accuracy of read data in the unreliable interval may be performed even before the operation of decoding of data, thereby determining more accurate data of the memory cell.

For example, as illustrated in FIG. 10, the data read unit 130 may additionally carry out a reading operation in order to determine a more accurate position of the threshold voltage of the memory cell, since there is a possibility that the threshold voltage of the memory cell is between $V_{SEN\_1A}$ of a first boundary voltage and $V_{SEN\_1B}$ of a second boundary voltage. When the threshold voltage is similar to the first boundary voltage, the data read unit 130 determines the data of the memory cell as a specific soft decision value so that the specific soft decision value includes information where the threshold voltage is closer to the first boundary voltage than the second boundary voltage.

Also, when the threshold voltage is closer to the second boundary voltage, the data read unit 130 determines the data of the memory cell as a specific soft decision value so that the specific soft decision value includes information where the threshold voltage is closer to the second boundary voltage than the first boundary voltage.

In example embodiments, as illustrated in FIG. 10, when LSB data of a certain memory cell is 1, a soft decision value is '11', and when the LSB data is 0, the soft decision value is '00'. In this regard, when a threshold voltage of the memory cell is closer to the first boundary voltage than the second boundary voltage, the data read unit 130 reads '10' as a soft decision value with respect to the data of the memory cell. Conversely, when the threshold voltage of the memory cell is closer to the second boundary voltage than the first boundary voltage, the data read unit 130 reads '01' as a soft decision value with respect to the data of the memory cell.

Thus, when a threshold voltage is between the first and the second boundary voltages, that is, the threshold voltage is in an unreliable interval, the data read unit 130 reads information about which boundary voltage is closer to the threshold voltage, and decodes the read information, so that the accuracy of the data is improved.

Also, explanations of another $V_{SEN\_1A}$ of a first boundary voltage and $V_{SEN\_1B}$ of a second boundary voltage are the same as those descriptions above, and thus their repetitive explanations will be omitted.

Figure 11:
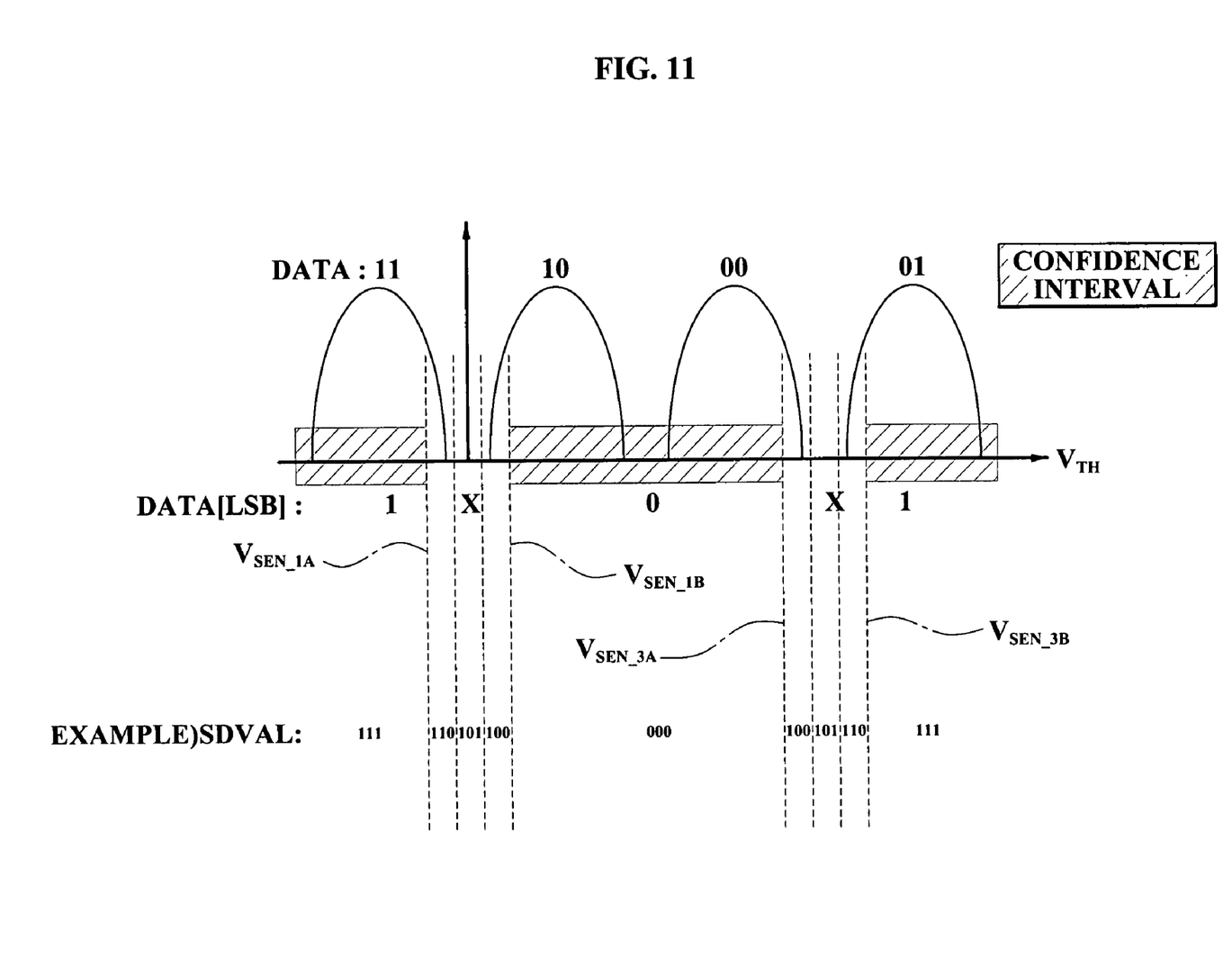
FIG. 11 is a diagram illustrating a soft decision value is additionally defined when comparing with FIG. 2, according to according to example embodiments.

FIG. 11 is diagram illustrating a soft decision value according to example embodiments. Hereinafter, a method for reading data according to example embodiments will be described with reference to FIG. 11, and also, with reference to FIGS. 1, 2, and 10. For reference, when comparing FIG. 11 with FIG. 10, a soft decision value is 2 bits in FIG. 10, and a soft decision value is 3 bits in FIG. 11. Thus, even though detailed explanation for the soft decision value of FIG. 11 will be omitted, example embodiments will be easily understood by those skilled in the art through the explanation of FIG. 10.

In example embodiments, as illustrated in FIG. 11, when LSB data of a certain memory cell is 1, a soft decision value is '111', and when the LSB data is 0, the soft decision value is '000'. In this regard, when a threshold voltage of the memory cell is closer to the first boundary voltage than the second boundary voltage, the data read unit 130 reads '110' as a soft decision value with respect to the data of the memory cell. Conversely, when the threshold voltage of the memory cell is closer to the second boundary voltage than the first boundary voltage, the data read unit 130 reads '100' as a soft decision value with respect to the data of the memory cell. Also, when the threshold voltage is in a specific middle interval between the first and the second boundary voltages, the data read unit 130 reads '101' as a soft decision value with respect to the data of the memory cell.

Soft decision values of 2 bits and 3 bits are used as examples, however, example embodiments are not limited thereto. A soft decision value having a different number of bits (n>3) may also be used as an example.

The data reading method according to example embodiments may be recorded in computer-readable media including program instructions to implement various operations embodied by a computer. The media may also include, alone or in combination with the program instructions, data files, data structures, and the like. The media and program instructions may be those specially designed and constructed for the purposes example embodiments, or they may be of the kind well-known and available to those having skill in the computer software arts. Examples of computer-readable media include magnetic media, for example, hard disks, floppy disks, and magnetic tape; optical media, for example, CD ROM disks and DVD; magneto-optical media, for example, optical disks; and hardware devices that are specially configured to store and perform program instructions, for example, read-only memory (ROM), random access memory (RAM), flash memory, and the like. The media may also be a transmission medium, for example, optical or metallic lines, wave guides, etc. including a carrier wave transmitting signals specifying the program instructions, data structures, etc. Examples of program instructions include both machine code, for example, produced by a compiler, and files containing higher level code that may be executed by the computer using an interpreter. The described hardware devices may be configured to act as one or more software modules in order to perform the operations of example embodiments.

As described above, according to example embodiments, a voltage area having a deteriorated reliability between states indicating what the data of the flash memory should be determined as, and then when a threshold voltage of the flash memory cell is positioned at a voltage area having a deteriorated reliability, the threshold voltage of the flash memory cell is outputted as a non-determinable value.

According to example embodiments, data of memory cells including a non-determinable value may be determined by decoding data of flash memory cells having been read through the method for reading data, thereby increasing reliability with respect to data of read memory cells.

According to example embodiments, a non-determinable value may be determined as data having a high or low value through a decoding process, even though a non-determinable value is output due to the change of the threshold voltage of the flash memory cell.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method for reading data, comprising:
    comparing a threshold voltage of a memory cell with a first boundary voltage;
    comparing the threshold voltage with a second boundary voltage having a higher voltage level than that of the first boundary voltage;
    determining data of the memory cell based on the compared results between the threshold voltage and the first boundary voltage, and between the threshold voltage and the second boundary voltage;
    decoding the determined data of a plurality of memory cells; and
    determining data programmed in the memory cells through the decoding,
    wherein the decoding performs a distance decoding by using the data of the memory cells.

2. The method of claim 1, wherein the determining of the data determines the data of the memory cell based on the compared results between the threshold voltage and the first boundary voltage, and between the threshold voltage and the second boundary voltage.

3. The method of claim 2, wherein the determining of the data determines the data of the memory cell as a preset non-determinable value when the threshold voltage is between the first and the second boundary voltages.

4. The method of claim 2, wherein the memory cell is a flash memory cell.

5. The method of claim 4, wherein the memory cell is of a Multi-Level Cell (MLC) method.

6. The method of claim 4, wherein the memory cell is of a Single Level Cell (SLC) method.

7. The method of claim 2, wherein the first and the second boundary voltages correspond to two voltages between boundary areas of identifying data programmed in the memory cell.

8. A computer-readable recording medium storing a program for implementing the method of claim 2.

9. The method of claim 1, wherein the determining of the data determines the data of the memory cell as a soft decision value based on whether the threshold voltage is similar to the first boundary voltage or to the second boundary voltage.

10. The method of claim 9, wherein the determining determines the data of the memory cell as a specific soft decision value when the threshold voltage is closer to the first boundary voltage than the second boundary voltage so that the specific soft decision value includes information where the threshold voltage is closer to the first boundary voltage than the second boundary voltage.

11. The method of claim 9, wherein the determining determines the data of the memory cell as a specific soft decision value when the threshold voltage is closer to the second boundary voltage than the first boundary voltage so that the specific soft decision value includes information where the threshold voltage is closer to the second boundary voltage than the first boundary voltage.

12. The method of claim 9, further comprising:
    decoding the determined data of a plurality of memory cells; and
    determining data programmed in the memory cells through the decoding.

13. A computer-readable recording medium storing a program for implementing the method of claim 9.

14. An apparatus for reading data, comprising:
    a voltage comparing unit which compares a threshold voltage of a memory cell with a first boundary voltage, and compares another threshold voltage of the memory cell with a second boundary voltage having a higher voltage level than that of the first boundary voltage, and then generates a result value depending on the compared results;
    a data read unit which determines the data of the memory cell based on the result value inputted from the voltage comparing unit;
    a decoding unit which receives and decodes an input of data of a plurality of memory cells determined by the data read unit; and
    a data determining unit which receives an input of the data of the memory cells decoded by the decoding unit and determines data programmed in the memory cells through the decoded data of the memory cells,
    wherein the data read unit determines the data of the memory cell as a preset non-determinable value when the threshold voltage represents a voltage between the first and the second boundary voltages according to the result value inputted from the voltage comparing unit, and
    wherein the decoding unit performs a distance decoding by using the data of the memory cells.

15. The apparatus of claim 14, wherein the data read unit determines the data of the memory cell as a preset non-determinable value when the threshold voltage represents a voltage between the first and the second boundary voltages according to the result value inputted from the voltage comparing unit.

16. The apparatus of claim 15, wherein the memory cell is a flash memory cell.

17. The apparatus of claim 16, wherein the memory cell is of a Multi-Level Cell (MLC) method.

18. The apparatus of claim 16, wherein the memory cell is of a Single Level Cell (SLC) method.

19. The apparatus of claim 14, wherein the data read unit determines the data of the memory cell as a soft decision value based on whether the threshold voltage is approximate to the first boundary voltage or to the second boundary voltage.

20. The apparatus of claim 19, wherein the data read unit determines the data of the memory cell as a specific soft decision value when the threshold voltage is closer to the first boundary voltage than the second boundary voltage so that the specific soft decision includes information where the threshold voltage is closer to the first boundary voltage than the second boundary voltage.

21. The apparatus of claim 19, wherein the data read unit determines the data of the memory cell as a specific soft decision value, when the threshold voltage is closer to the second boundary voltage than the first boundary voltage so that the specific soft decision value includes information where the threshold voltage is closer to the second boundary voltage than the first boundary voltage.

22. The apparatus of claim 19, further comprising:
   a decoding unit which receives and decodes an input of data of a plurality of memory cells determined by the data read unit; and
   a data determining unit which receives an input of the data of the memory cells decoded by the decoding unit and determines data programmed in the memory cells through the decoded data of the memory cells.

23. A method for reading data, comprising:
   comparing a threshold voltage of a memory cell with a first boundary voltage;
   comparing the threshold voltage with a second boundary voltage having a higher voltage level than that of the first boundary voltage;
   determining data of the memory cell based on the compared results between the threshold voltage and the first boundary voltage, and between the threshold voltage and the second boundary voltage;
   decoding the determined data of a plurality of memory cells; and
   determining data programmed in the memory cells through the decoding,
   wherein the decoding calculates a syndrome by using the data of the memory cells, and performs a decoding by using the calculated syndrome.

24. An apparatus for reading data, comprising:
   a voltage comparing unit which compares a threshold voltage of a memory cell with a first boundary voltage, and compares another threshold voltage of the memory cell with a second boundary voltage having a higher voltage level than that of the first boundary voltage, and then generates a result value depending on the compared results;
   a data read unit which determines the data of the memory cell based on the result value inputted from the voltage comparing unit;
   a decoding unit which receives and decodes an input of data of a plurality of memory cells determined by the data read unit; and
   a data determining unit which receives an input of the data of the memory cells decoded by the decoding unit and determines data programmed in the memory cells through the decoded data of the memory cells,
   wherein the data read unit determines the data of the memory cell as a preset non-determinable value when the threshold voltage represents a voltage between the first and the second boundary voltages according to the result value inputted from the voltage comparing unit, and
   wherein the decoding unit calculates a syndrome by using the data of the memory cells, and performs a decoding by using the calculated syndrome.

* * * * *